(12) United States Patent
Henkelman

(10) Patent No.: US 6,661,230 B1
(45) Date of Patent: Dec. 9, 2003

(54) MICROSTRUCTURED RF FLUX RETURN YOKE FOR INCREASED SENSITIVITY IN NMR EXPERIMENTS

(75) Inventor: R. Mark Henkelman, Toronto (CA)

(73) Assignee: Sunnybrook & Women's College Health Sciences Centre, Toronto (CA)

( * ) Notice: Subject to any disclaimer, the term of this patent is extended or adjusted under 35 U.S.C. 154(b) by 0 days.

(21) Appl. No.: 10/199,511

(22) Filed: Jul. 22, 2002

(51) Int. Cl.$^7$ .................................................. G01V 3/00
(52) U.S. Cl. ........................................ 324/318; 324/321
(58) Field of Search ............................... 324/318, 319, 324/320, 321, 322, 300, 306, 307, 309, 312, 314

(56) References Cited

U.S. PATENT DOCUMENTS 6,452,388 B1 * 9/2002 Reiderman et al. .......... 324/303
6,459,262 B1 * 10/2002 Wisler et al. ................ 324/303

FOREIGN PATENT DOCUMENTS

WO    WO 01/67125    3/2001

OTHER PUBLICATIONS

E. Shamonina, V.A. Kalinin, K.H. Ringhofer and L. Solymar, Title: Magneto–inductive waveguide, pp. 371–373 Electronics Letters, Apr. 11, 2002, vol. 38, No. 8.

* cited by examiner

Primary Examiner—Louis Arana
(74) Attorney, Agent, or Firm—Gowling Lafleur Henderson

(57) ABSTRACT

Apparatus for nuclear magnetic resonance includes a sample container, a receiver coil adjacent to and surrounding the sample container and a flux return yoke for directing magnetic flux from the same falling outside the receiver coil back thereto, the yoke comprising a material having a variable magnetic permeability tuned for a particular frequency range. The material of the return yoke with a variable magnetic permeability includes an array of capacitive/inductive elements. Each capacitive/inductive element has a low resistance conducting path and is configured such that a magnetic component (H) of electromagnetic radiation lying within a predetermined frequency band induces an electrical current (j(x)) to flow around said path and through the associated element. The size of the elements and their spacing apart are selected to provide a predetermined permeability in response to the received electromagnetic radiation.

13 Claims, 2 Drawing Sheets

MICROSTRUCTURED RF FLUX RETURN YOKE FOR INCREASED SENSITIVITY IN NMR EXPERIMENTS

FIELD OF THE INVENTION

The present invention relates to apparatus for nuclear magnetic resonance and is particularly concerned with improvements in signal-to-noise ratio associated therewith.

BACKGROUND OF THE INVENTION

Nuclear magnetic resonance experiments are inevitably limited by the signal to noise achievable in the experimental configuration. FIG. 1 shows a schematic representation of an idealized NMR experiment. A nuclear spin having a magnetic moment is represented by an arrow. The dipolar field $B_1$ associated with this spin is represented by several flux lines. The spin is located at the center of a spherical NMR sample. The sample and the spins contained within it are immersed in a homogeneous magnetic field $B_0$, which points in the z direction. A coordinate system defines the plane of the drawing to contain the x and y coordinates. When the spin is excited into the xy plane by a radio frequency (RF) pulse whose magnetic component parallels the y-axis, it precesses around its own center with a precession frequency given by $\omega$, which is proportional to the magnetic field. $\omega$ is known as the Larmor frequency and is given by $\omega=\gamma B_0$, where $\gamma$ is the gyromagnetic constant for a given isotope and $B_0$ is the static magnetic field strength. For hydrogen with $\gamma=42.58$ $MH_z\lambda^{-1}$ with a $B_0$ of 1.0 Tesla the precession frequency is 42.58 $MH_z$. Around the sample is placed a receiver coil, which is circular in shape in the xz plane. The receiver coil is connected to tuned and matched electronic circuits in the manner known in the art of nuclear magnetic resonance.

The sensitivity of a NMR experiment can be appreciated from the observation that many of the dipolar $B_1$ flux lines never intersect the receiving coil as the spin rotates within the sample. For voltage to be induced in the receiver coil, flux lines must intersect the coil as the spin rotates. Only a few of the peripheral flux lines intersect with the receiver coil in this manner. The situation could be improved by using a smaller coil closer to the spin, but the coil needs to remain outside the sample volume.

The signal-to-noise ration (SNR) is determined by the voltage induced in the receiving coils by the rotating dipole divided by the thermionic noise voltage in the receiving coil. In the particular case of large samples, the noise arises primarily from thermally generated magnetic noise within the sample. This is the situation in most human magnetic resonance imaging. However for higher frequency (greater than several hundred megahertz) NMR experiments with small samples, the noise is invariably primarily from the coil and electronics.

SUMMARY OF THE INVENTION

One way to increase the sensitivity of the receiving coil is to increase the amount of $B_1$ field intersecting the receiver coil during one revolution of the dipole. This can be accomplished by providing a high magnetic permeability return path for the $B_1$ emanating from the dipole.

In accordance with an aspect of the present invention more is provided an apparatus for nuclear magnetic resonance (NMR) comprising a sample container for a chemical sample; a receiver coil adjacent to the sample container, and a flux return yoke for guiding flux lines around the outside of the receiver coil causing the number of the flux lines intersecting with the receiver coil to be increased so as to increase a signal to noise ratio of an NMR experiment. The return yoke includes a material having a particular magnet permativity tuned for a particular frequency range, e.g. the Larmor frequency.

Advantages of the present invention include allowing equivalent SNR experiments to be executed with lower strength field magnets/and improving SNR with same level of magnetic field.

BRIEF DESCRIPTION OF THE DRAWINGS

The present invention will be further understood from the following detailed description with reference to the drawings in which.

DETAILED DESCRIPTION OF THE PREFERRED EMBODIMENT

Figure 2:
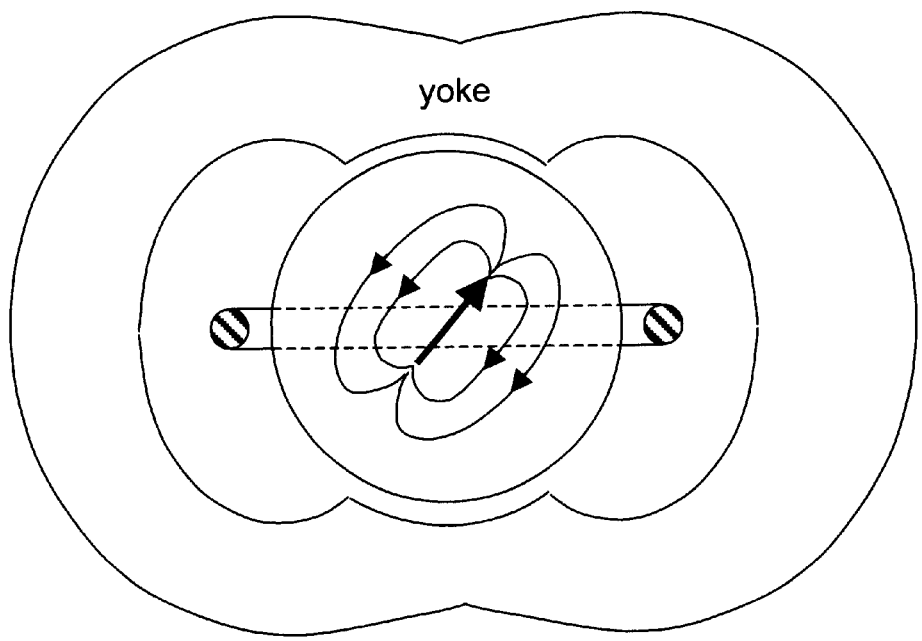
FIG. 2 illustrates a radio frequency yoke model in accordance with an embodiment of the present invention.
Figure 3:
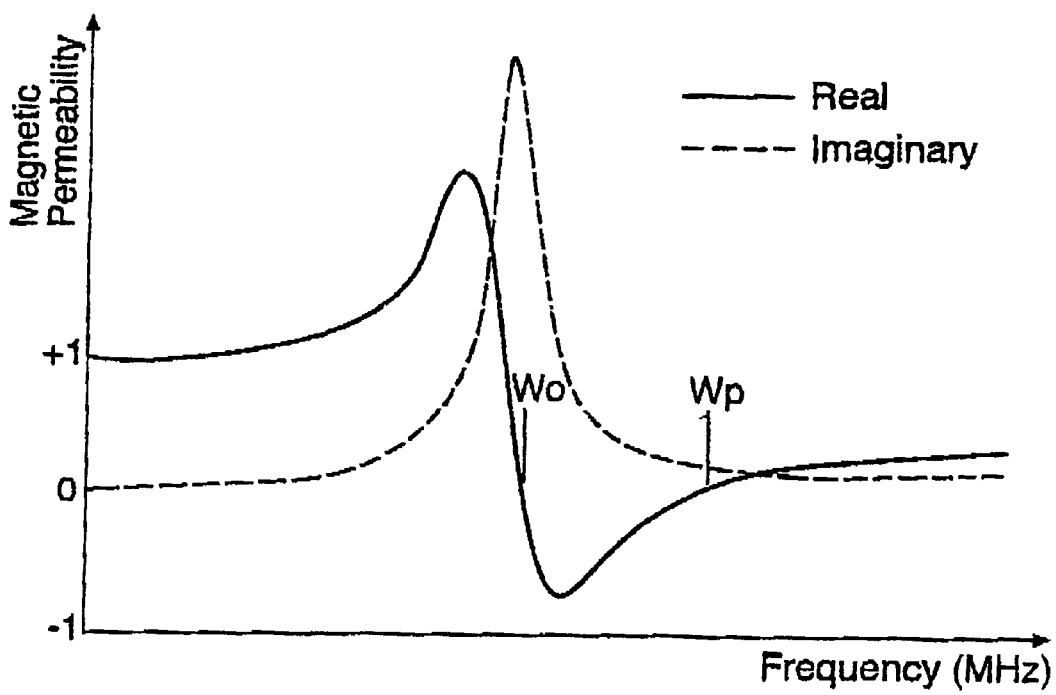
FIG. 3 graphically illustrates magnetic permeability as a function of frequency for a known material.

A representative embodiment of a yoke is shown in FIG. 2 in relation to the sample. This return yoke will guide the flux lines around the outside of the receive coil causing the number of flux lines intersecting with the coil to be increased.

To test the proposal of FIG. 2, a physical model of a yoke system has been built and demonstrated in the audio frequency range. The return yoke was constructed from a laminate iron transformer yoke of approximately similar geometry to that shown in FIG. 2 and a small permanent magnet was rotated at 60 Hz in the center of the receive coil. The voltage on the receive coil has been shown to increase by two fold with the introduction of the return yoke. The flux carried through the return yoke increases the time derivative of the flux $dB_1/dt$ intercepted by the coil and thence increases the voltage induced in the detector coil.

While the proof of the concept of the apparatus of FIG. 2, is encouraging and can be considered as a means of enhancing sensitivity in a NMR experiment, it is not practical for two reasons: 1. The iron of the retune yoke destroys the essential homogeneity of the $B_0$ magnetic field, which is needed to polarize the spins for the NMR experiment. 2. The frequency response of transformer iron at typical NMR frequency of several hundred megahertz is poor and the return yoke would be very lossy. Thus, a conventional iron retune yoke cannot be used for enhancing the sensitivity of a NMR experiment.

A suitable material for the return yoke needs to be "transparent" to the static magnetic field $B_0$ so as to not interfere with the homogeneity of $B_0$. The yoke material needs to effectively collect and return as much of the induced magnetic flux as practicable. Also the material for the return yoke needs to provide no interference to the RF pulse used to stimulate the sample.

In International Patent Application WO 00/41270 published Jul. 13, 2000, Holden et al disclose a material having magnetic properties when exposed to electromagnetic radiation. The material comprises an array of capacitive elements each capable of responding to an external magnetic field by inducing an electric current whose presence affects the magnetic properties of the material.

On pages 2 through 19 and FIGS. 1 through 11 various forms of the material are described along with formula for calculating the size of the capacitive/inductive elements to achieve desired properties. The entire specification of WO 00/41270 is hereby incorporated herein by reference.

Figure 1:
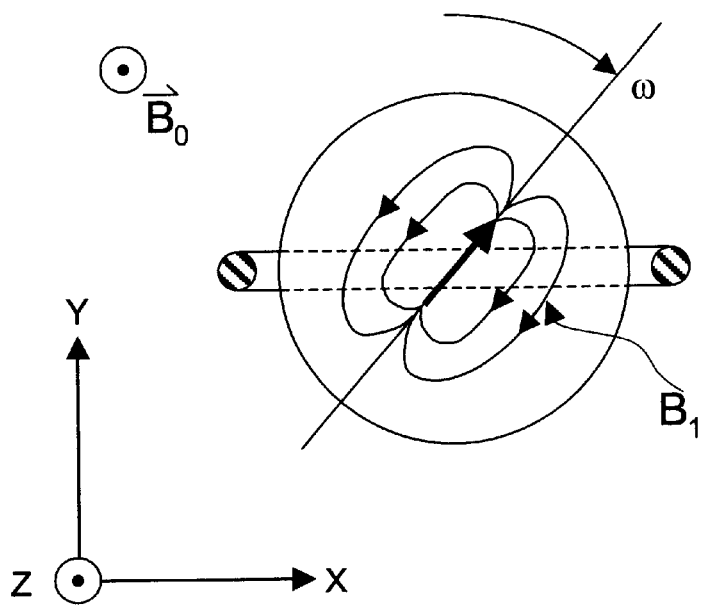
FIG. 1 illustrates a schematic representation of an idealized NMR experiment.

In International Patent Application WO 02/03500 published Jun. 20, 2001, the use of the material of WO 00/41270 to create a lens for focusing magnetic resonance imaging signals from a patient onto receiving coils remote from the patient is disclosed. FIG. 1 of WO 02/03500 is reproduced herein as FIG. 3, which shows the variation of the real and imaginary components of magnetic permeability of known microstructured materials as a function of r.f. frequency.

This microstructure material has enhanced nonlinear permeability. The behavior of this material in the microwave and radio frequency range is analogous to photonic band gap materials in the optical range. One particular embodiment of such material consists of spiral rolled sheets of dielectric material with a non-magnetic surface conductor. The rolled sheets are placed beside each other in a regular hexagonal lattice. This periodic structure contains only distributed capacitance and inductance. Due to the non linearity of the magnetic permeability of the material, it is possible, through selection of the capacitive/inductive elements in the matrix, to create material that can be tuned to particular frequencies corresponding to the frequency of NMR experiment. Equations relating the dimensions of the microstructure of such materials to their resonance frequency are given in WO 00/41270.

Because these materials are non-magnetic, they can be introduced into a NMR experiment without negative interference on $B_0$. They can also be designed to be tuned to the frequency of the NMR experiment such that they serve as radio-frequency flux guides and constitute a return yoke for the dipolar $B_1$ field. By analogy to the audio range experiment, this will result in an increased signal received in the radio-frequency receiver coil without an associated increase in noise, hence, improving the signal-to-noise ratio of the NMR experiment. This increased SNR can be used for improved sensitivity enabling measurements on smaller sample sizes. Alternatively, it will allow equivalent SNR experiments to be done using lower $B_0$ field magnets at considerably decreased costs. As well, using a lower $B_0$ may be desirable when the sample may be damaged by higher $B_0$ fields.

The material is available in product form as a rope-like material with embedded capacitive/inductive elements. With regards to the return yoke it was important that the ends of the rope pieces be located approximately 180 degrees around the sample, so as to allow vectorial addition of the magnetic fields. It is also desirable to lay the rope material such that the capacitive elements are radially aligned with the rope. Provided the two ends of each fibre of the flux guide (rope) are approximately opposed across the sample, the flux guides can be distributed about the sample. The sample container could be an animate object, such as a person or mouse.

The frequency of the NMR experiment and the frequency of the radio frequency excitation pulse are identical and preferably range from 100 MHz to 1000 MHz, although operation outside this range is possible.

What is claimed is:

1. Apparatus for nuclear magnetic resonance (NMR) comprising:
   a sample container for a chemical sample;
   a receiver coil adjacent to the sample container; and
   a flux return yoke for guiding flux lines around the outside of the receiver coil causing the number of the flux lines intersecting with the receiver coil to be increased so as to increase a signal to noise ratio of an NMR experiment the yoke comprising a material having a variable magnetic permeability tuned for a particular frequency range.

2. An apparatus as claimed in claim 1, wherein the material of the return yoke with magnetic permeability comprising an array of capacitive/inductive elements, wherein each capacitive/inductive element includes a low resistance conducting path and is such that a magnetic component (H) of electromagnetic radiation lying within a predetermined frequency band induces an electrical current (j(x)) to flow around said path and through said associated element, and wherein the size of the elements and their spacing apart are selected such as to provide a predetermined permeability in response to said received electromagnetic radiation.

3. An apparatus as claimed in claim 2, wherein each capacitive/inductive element is of a substantially circular section.

4. An apparatus as claimed in claim 2 or claim 3, wherein each capacitive/inductive element is in the form of two or more concentric cylinders in which each cylinder has a gap running along its length.

5. An apparatus as claimed in claim 3, wherein each cylinder comprises a plurality of stacked planar sections each of which is electrically insulated from adjacent sections.

6. An apparatus as claimed in claim 2 or claim 3, wherein each capacitive/inductive element is in the form of a conductive sheet wound as a spiral.

7. An apparatus as claimed in claim 6, wherein successive turns of the spiral are progressively displaced along the axis of the spiral to form a helical structure with adjacent turns partially overlapping.

8. An apparatus as claimed in claim 1, wherein the axes of the capacitive/inductive elements point in a common direction.

9. An apparatus as claimed in claim 1 wherein the receiver coil is a super conducting ratio frequency receiver coil.

10. An apparatus as claimed in claim 1 wherein the geometry of the flux return yoke shown in FIG. 2 can be adapted to a more distributed pattern of many flux tubes connecting points at the surface of the spherical sample to opposite points located diametrically on the side of the sample.

11. An apparatus as claimed in claim 1 wherein the sample container is spherical.

12. An apparatus as claimed in claim 1 wherein the sample container is cylindrical.

13. An apparatus as claimed in claim 1 wherein the sample container is animate.

* * * * *